United States Patent
Seo et al.

(10) Patent No.: US 10,536,120 B2
(45) Date of Patent: Jan. 14, 2020

(54) MULTI-PATH COMMUNICATION DEVICE FOR SHARING FEEDBACK PATH FOR DIGITAL PRE-DISTORTION

(71) Applicant: SOLiD, INC., Seongnam-si, Gyeonggi-do (KR)

(72) Inventors: Kwang Nam Seo, Guri-si (KR); Do Yoon Kim, Bucheon-si (KR); Hyoung Ho Kim, Seoul (KR)

(73) Assignee: SOLiD, INC., Seongnam-si (KR)

( * ) Notice: Subject to any disclaimer, the term of this patent is extended or adjusted under 35 U.S.C. 154(b) by 0 days.

(21) Appl. No.: 16/077,917

(22) PCT Filed: Mar. 28, 2016

(86) PCT No.: PCT/KR2016/003144
§ 371 (c)(1),
(2) Date: Aug. 14, 2018

(87) PCT Pub. No.: WO2017/142124
PCT Pub. Date: Aug. 24, 2017

(65) Prior Publication Data
US 2019/0052235 A1    Feb. 14, 2019

(30) Foreign Application Priority Data
Feb. 15, 2016    (KR) .................. 10-2016-0017055

(51) Int. Cl.
*H03F 3/19* (2006.01)
*H03F 1/32* (2006.01)
(Continued)

(52) U.S. Cl.
CPC ............. *H03F 1/3247* (2013.01); *H03F 3/19* (2013.01); *H03F 3/245* (2013.01); *H04B 1/0475* (2013.01);
(Continued)

(58) Field of Classification Search
CPC ................. H03F 1/3247; H03F 1/3241; H03F 2200/451; H03F 2201/3233;
(Continued)

(56) References Cited

U.S. PATENT DOCUMENTS

| 6,751,447 | B1 | 6/2004 | Jin et al. | |
| 8,218,678 | B2 * | 7/2012 | Kim | H03F 1/3247 |
| | | | | 375/297 |

(Continued)

FOREIGN PATENT DOCUMENTS

KR    10-2001-0062808 A    7/2001

OTHER PUBLICATIONS

Korean Notice to Submit Response issued in KR 10-2016-0017055 dated Dec. 6, 2016.
(Continued)

*Primary Examiner* — Rahel Guarino
(74) *Attorney, Agent, or Firm* — Sughrue Mion, PLLC

(57) ABSTRACT

The present invention, which relates to a multi-path communication device for sharing a feedback path for digital pre-distortion, includes: a DPD processing unit configured to output a plurality of pre-distorted signals by respectively pre-distorting a plurality of input signals, to output an $n^{th}$ control signal when an $n^{th}$ input signal is input, and to output an $n^{th}$ pre-distorted signal using an $n^{th}$ feedback signal input in response to the $n^{th}$ control signal; a power amplifying unit configured to amplify each of the plurality of pre-distorted signals and output a plurality of amplified signals; a signal combining unit configured to combine some of each of the plurality of amplified signals and output combined feedback signal; and a signal selection unit configured to select and output only the $n^{th}$ feedback signal from the combined feedback signal according to the input $n^{th}$ control signal, thereby preventing an increase in the size of a device and (Continued)

manufacturing cost thereof caused by a plurality of DPD feedback paths.

4 Claims, 3 Drawing Sheets

(51) Int. Cl.
    *H03F 3/24*     (2006.01)
    *H04B 1/04*     (2006.01)

(52) U.S. Cl.
    CPC .. *H03F 2200/129* (2013.01); *H03F 2200/372* (2013.01); *H03F 2200/451* (2013.01); *H04B 2001/0425* (2013.01)

(58) Field of Classification Search
    CPC ...... H03F 2200/156; H03F 3/19; H03F 3/245; H03F 2200/129; H03F 2200/372; H04B 2001/0425; H04B 1/62; H04B 17/13; H04B 1/0475; H04L 27/368; H04L 27/2626; H04L 25/03343; H04L 27/367; H04L 27/362; H04L 5/06
    See application file for complete search history.

(56) References Cited

U.S. PATENT DOCUMENTS

| | | | |
|---|---|---|---|
| 8,477,871 B2* | 7/2013 | Neumann | H03F 1/3247 |
| | | | 375/295 |
| 8,803,603 B2 | 8/2014 | Wimpenny | |
| 8,948,301 B2 | 2/2015 | Rollins | |
| 2012/0083229 A1* | 4/2012 | Kenington | H04B 1/0483 |
| | | | 455/114.3 |
| 2014/0176224 A1* | 6/2014 | Winiecki | G06G 7/12 |
| | | | 327/355 |

OTHER PUBLICATIONS

International Search Report of PCT/KR2016/003144 dated Nov. 7, 2016.

* cited by examiner

MULTI-PATH COMMUNICATION DEVICE FOR SHARING FEEDBACK PATH FOR DIGITAL PRE-DISTORTION

CROSS-REFERENCE TO RELATED APPLICATIONS

This application is a National Stage of PCT International Application No. PCT/KR2016/003144, filed Mar. 28, 2016, and claims priority from Korean Patent Application No. 10-2016-0017055, filed Feb. 15, 2016, the contents of which are incorporated herein by reference in their entireties.

BACKGROUND

1. Field

The present invention relates to a communication device for supporting a multi-path such as a multiple-input multiple-output (MIMO) communication device and a multi-band communication device, and more particularly, to a multi-path communication device for sharing a feedback path for digital pre-distortion.

2. Description of the Related Art

A digital pre-distortion (DPD) power amplifier (hereinafter referred to as a DPD power amplifier) included in a communication device such as a repeater is intended to improve a nonlinear characteristic of a power amplifier and to pre-distort a digital signal before amplifying the digital signal so that input and output are kept linear. The DPD power amplifier for a single path includes a digital up-converter, a peak to average power ratio (PAPR) controller, a DPD processor, a digital to analog converter (DAC), an amplifier, a coupler, a DPD feedback path, and the like. An operation of the DPD power amplifier for a single path will be briefly described later below.

A baseband digital signal input to the DPD power amplifier is up-converted to a radio frequency (RF) band signal by the digital up-converter, and the RF band digital signal has a low PAPR by the PAPR controller. The digital signal is pre-distorted by the DPD processor, converted into an analog signal by the DAC, and amplified by the amplifier. The signal amplified by the amplifier is band-filtered by a band-pass filter and then transmitted through an antenna. Furthermore, the signal amplified by the amplifier is partially extracted by the coupler, and the extracted signal is provided to the DPD processor through the DPD feedback path. In addition, the DPD processor performs pre-distortion according to an output of the amplifier provided through the DPD feedback path.

Meanwhile, when the communication device has a plurality of transmission paths, the DPD power amplifier includes an independent DPD feedback path for each transmission path. That is, a multi-path communication device (a communication device capable of processing a plurality of signals having different frequency bands, such as a multi-antenna communication device and/or a multi-band communication device) includes DPD feedback paths corresponding to the number of transmission paths to process a plurality of signals having different frequency bands. However, each of the DPD feedback paths includes many components such as a mixer, an analog to digital converter (ADC), and a filter, thereby causing an increase in the size of a communication device and manufacturing cost thereof.

Accordingly, there is a need for an alternative that can solve an increase in the size of a device and manufacturing cost thereof caused by a plurality of DPD feedback paths in the multi-path communication device using the DPD power amplifier.

SUMMARY

The present invention prevents an increase in the size of a device and manufacturing cost thereof caused by a plurality of DPD feedback paths in a multi-path communication device using a DPD power amplifier.

According to an aspect of the present invention, a communication device for processing signals in n different frequency bands includes: a DPD processing unit configured to output a plurality of pre-distorted signals by respectively pre-distorting a plurality of input signals, to output an $n^{th}$ control signal when an $n^{th}$ input signal is input, and to output an $n^{th}$ pre-distorted signal using an $n^{th}$ feedback signal input in response to the $n^{th}$ control signal; a power amplifying unit configured to amplify each of the plurality of pre-distorted signals and output a plurality of amplified signals; a signal combining unit configured to combine some of each of the plurality of amplified signals and output combined feedback signal; and a signal selection unit configured to select and output only the $n^{th}$ feedback signal from the combined feedback signal according to the input $n^{th}$ control signal, wherein the n is a natural number.

According to an example embodiment, the communication device may further include a coupler configured to couple some of each of the plurality of amplified signals and output the coupled amplified signals to the signal combining unit when the plurality of amplified signals are received from the power amplifying unit.

According to an example embodiment, the $n^{th}$ feedback signal may correspond to some of an $n^{th}$ amplified signal obtained by amplifying the $n^{th}$ pre-distorted signal.

According to an example embodiment, the signal selection unit may include a filter for filtering only the $n^{th}$ feedback signal from the combined feedback signal according to the $n^{th}$ control signal.

According to an example embodiment, the communication device may further include a digital-to-analog converter configured to convert the plurality of pre-distorted signals into analog signals and output the converted pre-distorted signals when the plurality of pre-distorted signals are received from the DPD processing unit, wherein the power amplifying unit is configured to amplify each of the plurality of pre-distorted signals that are converted into the analog signals.

According to an example embodiment, the communication device may further include an analog-to-digital converter configured to convert the combined feedback signal into digital signal and output the combined feedback signal when the combined feedback signal is received from the signal combining unit, wherein the signal selection unit is configured to select and output only the $n^{th}$ feedback signal from the combined feedback signal that are converted into the digital signal, wherein the $n^{th}$ feedback signal is a digital signal.

According to the present invention, a feedback path may be shared through a single DPD feedback path in a multi-path communication device, thereby preventing an increase in the size of a device and manufacturing cost thereof caused by a plurality of DPD feedback paths.

DETAILED DESCRIPTION OF EXEMPLARY EMBODIMENTS

Figure 1:
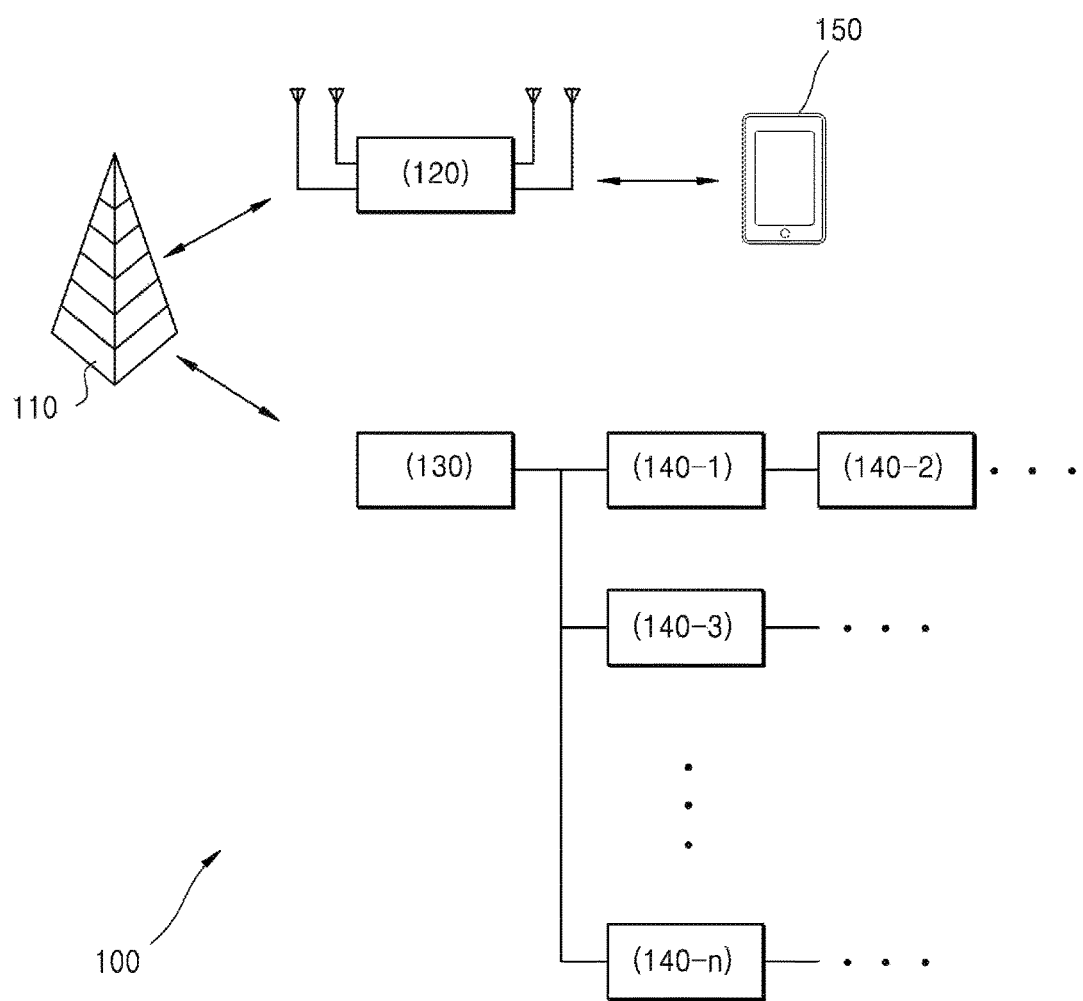
FIG. 1 is a configuration diagram of a mobile communication system according to an embodiment of the present invention.

Since the present invention may have diverse modified embodiments, preferred embodiments are illustrated in the drawings and are described in the detailed description. However, this does not limit the present invention within specific embodiments and it should be understood that the present invention covers all the modifications, equivalents, and replacements within the idea and technical scope of the present invention.

In the description of the present invention, certain detailed explanations of the related art are omitted when it is deemed that they may unnecessarily obscure the essence of the present invention. In addition, numeral figures (for example, 1, 2, and the like) used during describing the specification are just identification symbols for distinguishing one element from another element. Further, in the specification, if it is described that one component is "connected" or "accesses" the other component, it is understood that the one component may be directly connected to or may directly access the other component but unless explicitly described to the contrary, another component may be "connected" or "access" between the components. In addition, terms including "unit", "er", "or", "module", and the like disclosed in the specification mean a unit that processes at least one function or operation and this may be implemented by hardware or software or a combination of hardware and software.

Moreover, it is intended to clarify that components in the specification are distinguished in terms of primary functions of the components. That is, two or more components to be described below may be provided to be combined to one component or one component may be provided to be divided into two or more components for each more subdivided function. In addition, each of the respective components to be described below may additionally perform some or all functions among functions which other components take charge of in addition to a primary function which each component takes charge of and some functions among the primary functions which the respective components take charge of are exclusively charged by other components to be performed, of course.

A distributed antenna system according to an embodiment of the present invention is a coverage system for an in-building service that delivers voice communication and data communication with high quality and seamlessness. It is also a system for servicing analog and digital telephone systems serviced in multiple bands with one antenna. The distributed antenna system according to an embodiment of the present invention may be installed in general public institutions and private facilities such as a shopping mall, a hotel, a campus, an airport, a hospital, a subway, a sports complex, and a convention center. The distributed antenna system according to an embodiment of the present invention improves a poor propagation environment in a building, improves a poor received signal strength indication (RSSI) and the overall reception sensitivity of a mobile terminal, chip energy/other interferences (Ec/Io), and provides a mobile communication service to every corner of the building so that a user of the mobile communication service can freely talk anywhere in the building. The distributed antenna system according to an embodiment of the present invention may support the mobile communication standard used worldwide.

For example, the distributed antenna system may support a time division duplex (TDD) service as well as a frequency division duplex (FDD) service, a very-high frequency (VHF), an ultra-high frequency (UHF), and frequencies of 700 MHz, 800 MHz, 850 MHz, 900 MHz, 1900 MHz, 2100 MHz, and 2600 MHz bands. Furthermore, the distributed antenna system may support a number of mobile communication standards such as a typical analog mobile communication service, that is, an advanced mobile phone service (AMPS), digital time-division multiple access (TDMA), code-division multiple access (CDMA), wideband code-division multiple access (WCDMA), high-speed downlink packet access (HSDPA), long-term evolution (LTE), LTE-advanced (LTE-A), and so on.

Hereinafter, embodiments of the present invention will be described in detail.

FIG. 1 is a configuration diagram of a mobile communication system 100 according to an embodiment of the present invention.

Referring to FIG. 1, the mobile communication system 100 according to an embodiment of the present invention may include a base station 110, which is a multi-path communication device using a DPD power amplifier, a wireless repeater 120, a head-end unit 130, remote units 140-1, 140-2, . . . , 140-n (where n is a natural number) (hereinafter, the head-end unit 130 and the remote unit 140-n are referred to as a distributed antenna system), and a mobile communication terminal 150.

Communication devices (the base station 110, the wireless repeater 120, and the distributed antenna systems 130 and 140-n) may connect a mobile communication network to the mobile communication terminal 150 for a mobile communication service. That is, a signal transmitted from the mobile communication terminal 150 may be amplified by the wireless repeater 120 or the distributed antenna systems 130 and 140-n and then transmitted to a receiving side (e.g., a receiver terminal (not shown)) via the base station 110. Furthermore, a signal transmitted from a transmitting side (e.g., a transmitter terminal (not shown)) may be amplified by the wireless repeater 120 or the distributed antenna systems 130 and 140-n via the base station 110 and then transmitted to the mobile communication terminal 150. That is, when a distance between the base station 110 and the mobile communication terminal 150 is too long to smoothly transmit signals, the wireless repeater 120 or the distributed antenna systems 130 and 140-n may perform signal amplification between the base station 110 and the mobile communication terminal 150.

The wireless repeater 120 and the distributed antenna systems 130 and 140-n may be implemented as a communication device supporting a multi-path in relaying signals between the base station 110 and the mobile communication terminal 150. For example, the communication devices (the base station 110, the wireless repeater 120, and the distributed antenna systems 130 and 140-n) may be implemented as a multiple-input multiple-output (MiMO) communication device having a plurality of reception antennas or reception ports and a plurality of transmission antennas or transmission ports to transmit signals through a multi-path. The communication devices (the base station 110, the wireless repeater 120, and the distributed antenna systems 130 and 140-$n$) may be implemented as a multi-band communication device capable of transmitting a plurality of frequency bands through a multi-path.

The communication devices (the base station 110, the wireless repeater 120, and the distributed antenna systems 130 and 140-$n$) may include a DPD power amplifier for pre-distorting a signal before amplifying the signal to keep input and output linear, and a plurality of feedback signals for distortion processing may be combined and transmitted through a single path. The communications devices (base station 110, wireless repeater 120, distributed antenna systems 130 and 140-$n$) including such a single feedback path will be described in more detail later below with reference to FIGS. 2 to 3.

Figure 2:
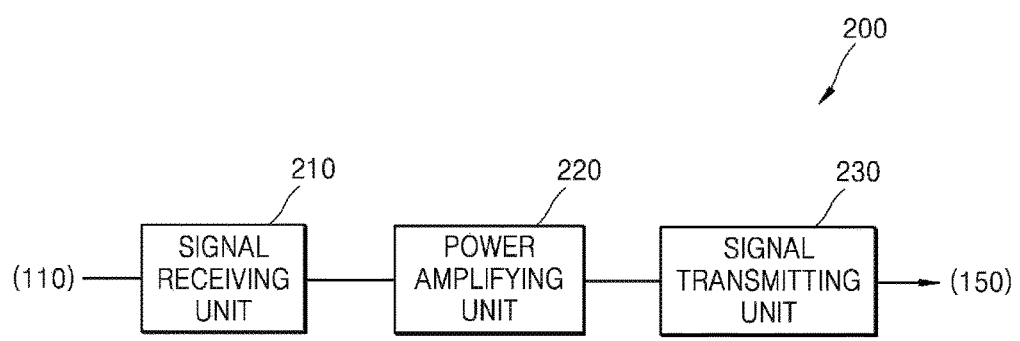
FIG. 2 is a configuration diagram of a communication device according to an embodiment of the present invention.

FIG. 2 is a configuration diagram of a communication device 200 according to an embodiment of the present invention.

The multi-path communication device 200 using a DPD power amplifier amplifies and relays a signal so as to smoothly communicate with the mobile communication terminal 150 (see FIG. 1) in the mobile communication system 100 (see FIG. 1). For example, the multi-path communication device 200 using a DPD power amplifier may include the base station 110 (see FIG. 1), the wireless repeater 120 (see FIG. 1), and the distributed antenna systems 130 and 140-$n$ (see FIG. 1). For convenience of explanation, FIG. 2 shows only components for transmitting a downlink signal received from the base station 110 (see FIG. 1) to the communication terminal 150 (see FIG. 1) in the wireless repeater 120 (see FIG. 1) and the distributed antenna systems 130 and 140-$n$. Components for transmitting an uplink signal of the mobile communication terminal 150 (see FIG. 1) to the base station 110 (see FIG. 1) may correspond to the configurations for transmitting the downlink signal, a detailed description of the components for transmitting the uplink signal will not be given herein.

Referring to FIG. 2, the communication device 200 may include a signal receiving unit 210, a power amplifying unit 220, and a signal transmitting unit 230.

The signal receiving unit 210 may receive a reception signal provided from the base station 110 (see FIG. 1) through a plurality of reception antennas of the wireless repeater 120 (see FIG. 1) or a reception port of the distributed antenna systems 130 and 140-$n$ (see FIG. 1). The reception signal may include a downlink signal and a plurality of frequency band signals of the base station 110 (see FIG. 1), and may be transmitted to a multi-path through a plurality of reception antennas or a reception port.

The signal receiving unit 210 may be configured to transmit the reception signal to the multi-path to remove noise in each path, to perform frequency-down conversion and analog-to-digital conversion, and to output the converted signal. For example, the signal receiving unit 210 may include a low noise amplifier for amplifying the reception signal by minimizing noise, an intermediate frequency (IF) down converter for converting the reception signal amplified by the low noise amplifier from a signal of a radio frequency (RF) band into a signal of an intermediate frequency band, a frequency-down converter for converting the reception signal of the intermediate frequency band into a baseband signal, and an analog-to-digital converter (ADC) for converting the reception signal into a digital signal. Accordingly, the signal receiving unit 210 may perform signal processing for amplifying the reception signal in the power amplifying unit 220. Here, the frequency-down converter may be optionally omitted.

The power amplifying unit 220 receives a reception signal processed (e.g., noise removal, frequency-down conversion, and analog-to-digital conversion) by the signal receiving unit 210. The received signal may be pre-distorted and amplified based on a nonlinear characteristic of a power amplifier provided in the power amplifying unit 220 and output to the signal transmitting unit 230.

The signal transmitting unit 230 may select one band from a plurality of signals amplified by the power amplifying unit 220 and output the band as a single output signal. In addition, the signal transmitting unit 230 may remove noise of the output signal, perform frequency-up conversion, and transmit the signal to the terminal 150 (see FIG. 1). For example, the signal transmitting unit 230 may include a multiplexer for selecting one of a plurality of input signals and outputting a single output signal, a low noise amplifier for amplifying the output signal by minimizing noise, and a frequency-up-converter for up-converting the amplified signal into a signal of a radio frequency band. Accordingly, the signal transmitting unit 230 may transmit the signal of a radio frequency band to the terminal 150 (see FIG. 1) through a transmission antenna. Here, the frequency-up-converter may be optionally omitted.

The power amplifying unit 220 amplifies signals transmitted to respective paths in the multi-path communication device 200 using the DPD power amplifier by a power amplifier provided in each path and outputs the amplified signals to the signal transmitting unit 230. Also, the signals amplified in each path are partially extracted and fed back, and the extracted feedback signals may be combined to use a single feedback path. The power amplifying unit 220 using such a single feedback path will be described in more detail later below with reference to FIG. 3.

Figure 3:
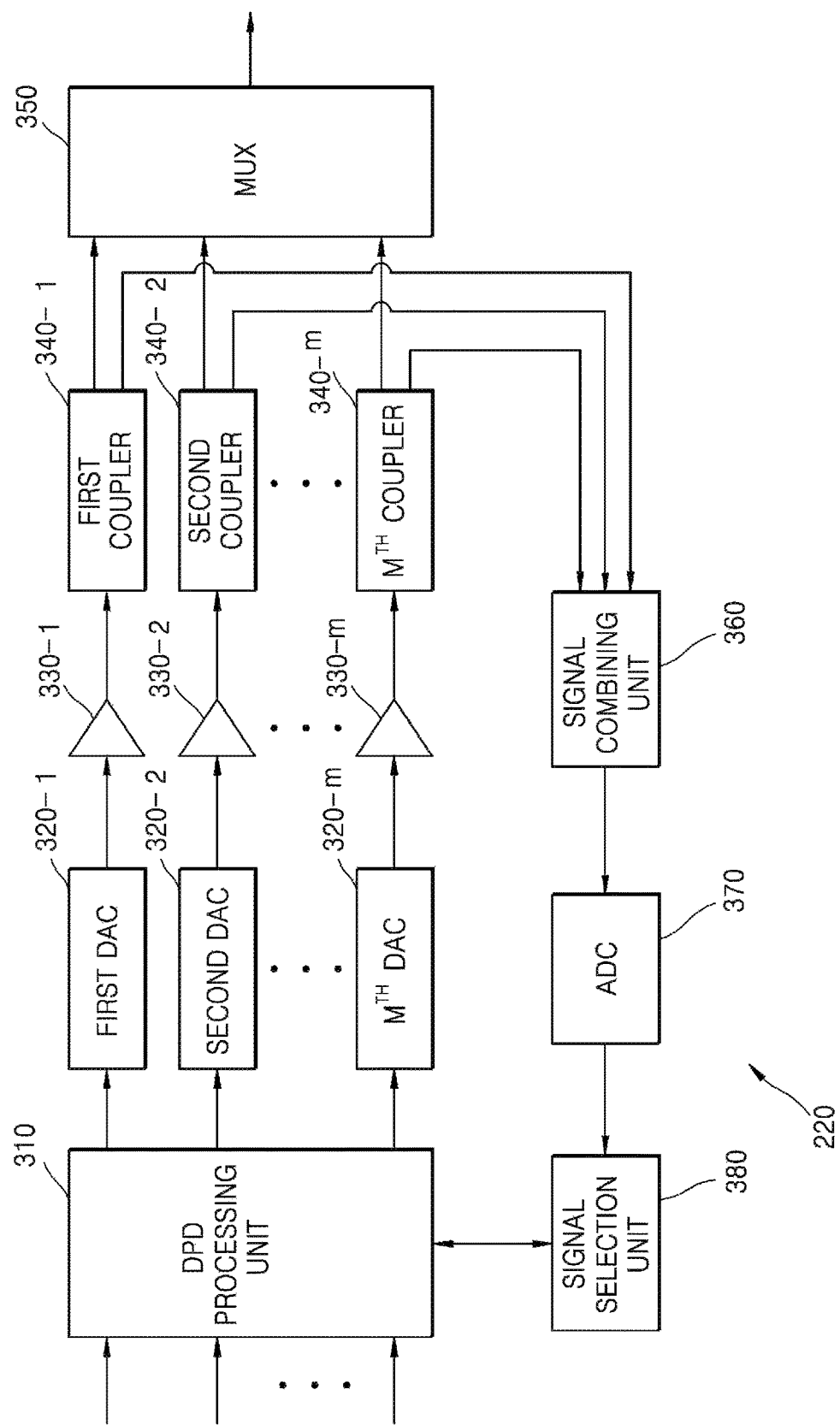
FIG. 3 is a configuration diagram of a power amplifying unit according to an embodiment of the present invention.

FIG. 3 is a configuration diagram of a power amplifying unit according to an embodiment of the present invention.

Referring to FIG. 3, the power amplifying unit 220 may include a DPD processing unit 310, first to $m^{th}$ digital-to-analog converters (DACs) 320-1, 320-2, ..., and 320-$m$ (where m is a natural number), first to $m^{th}$ power amplifiers 330-1, 330-2, ..., 330-$m$, first to $m^{th}$ couplers 340-1, 340-2, ..., 340-$m$, a multiplexer (MUX) 350, a signal combining unit 360, an analog-to-digital converter (ADC) 370, and a signal selection unit 380. The MUX 350 may be optionally included in the signal transmitting unit 230 (see FIG. 2).

The DPD processing unit 310 pre-distorts each of a plurality of input signals output from the signal receiving unit 210 (see FIG. 2) based on nonlinear characteristics of the first to $m^{th}$ power amplifiers 330-1, 330-2, ..., 330$m$, and outputs pre-distorted signals (hereinafter referred to as pre-distorted signals) to the first to $m^{th}$ DACs 320-1, 320-2, ..., and 320-$m$.

The first to $m^{th}$ DACs 320-1, 320-2, ..., and 320-$m$ receive the first to $m^{th}$ pre-distorted signals from the DPD processing unit 310 through respective paths, convert the first to $m^{th}$ pre-distorted signals into first to $m^{th}$ analog signals, and output the first to $m^{th}$ analog signals to the first to $m^{th}$ power amplifiers 330-1, 330-2, ..., 330$m$ corresponding to the respective paths.

The first to $m^{th}$ power amplifiers 330-1, 330-2, ..., 330$m$ amplify the first to $m^{th}$ analog signals received from the first to $m^{th}$ DACs 320-1, 320-2, ..., and 320-$m$, respectively, and output the amplified signals (hereinafter referred to as amplified signals) to the first to $m^{th}$ couplers 340-1, 340-2, ..., 340-$m$, respectively.

The first to $m^{th}$ couplers 340-1, 340-2, ..., 340-$m$ receive first to $m^{th}$ amplified signals from the first to $m^{th}$ power amplifiers 330-1, 330-2, ..., 330$m$ to output the first to $m^{th}$ amplified signals to the MUX 35, and extract some of each of the first to $m^{th}$ amplified signals to output the extracted signals to the signal combining unit 360.

The MUX 350 receives first to $m^{th}$ amplified signals received from the first to $m^{th}$ couplers 340-1, 340-2, ..., and 340-$m$ and outputs the $m^{th}$ amplified signal to a single line.

The signal combining unit 360 receives some of the first to $m^{th}$ amplified signals extracted by the first to $m^{th}$ couplers 340-1, 340-2, ..., 340-$m$ from the first to $m^{th}$ couplers 340-1, 340-2, ..., 340-$m$. The signal combining unit 360 combines some of the extracted first to $m^{th}$ amplified signals to one feedback signal (hereinafter referred to as a combined feedback signal) and outputs the combined feedback signal to the ADC 370. In this case, a method of combining a plurality of feedback signals to one feedback signal may vary. It will be understood by one of ordinary skill in the art that the method of coupling signals cannot limit the scope of the present invention.

The ADC 370 receives a combined feedback signal from the signal combining unit 360 through a single feedback path. The ADC 370 may convert the combined feedback signal into a digital signal and output the combined feedback signal to the signal selection unit 380.

The signal selection unit 380 receives the combined feedback signal from the ADC 370 and receives an $m^{th}$ control signal from the DPD processing unit 310. The signal selection unit 380 may filter an $m^{th}$ feedback signal corresponding to the $m^{th}$ control signal from the combined feedback signal and output the $m^{th}$ feedback signal to the DPD processing unit 310. Furthermore, the signal selection unit 380 may include a filter for filtering the $m^{th}$ feedback signal corresponding to the $m^{th}$ control signal from the combined feedback signal. A method of filtering the $m^{th}$ feedback signal corresponding to the $m^{th}$ control signal may vary. It will be understood by one of ordinary skill in the art that the method of filtering cannot limit the scope of the present invention.

Although a general operation procedure of the power amplifying unit 220 has been described above with reference to the configuration of the power amplifying unit 220 shown in FIG. 3, it goes without saying that the operation of the power amplifying unit 220 is not limited to that described above.

As an example, when an $m^{th}$ input signal is input, the DPD processing unit 310 generates the $m^{th}$ control signal for selecting the $m^{th}$ feedback signal and outputs the $m^{th}$ control signal to the signal selection unit 380. The DPD processing unit 310 outputs the $m^{th}$ pre-distorted signal obtained by pre-distorting the $m^{th}$ input signal to the $m^{th}$ DAC 320-$m$ using the $m^{th}$ feedback signal received from the signal selection unit 380 in response to the $m^{th}$ control signal. For example, when a first input signal is input, the DPD processing unit 310 generates a first control signal for selecting a first feedback signal and outputs the first control signal to the signal selection unit 380. The DPD processing unit 310 outputs the first pre-distorted signal to the first DAC 320-1 using the first feedback signal received from the signal selection unit 380 in response to the first control signal. When the second input signal is input, the DPD processing unit 310 generates a second control signal for selecting a second input signal, and outputs the second control signal to the signal selection unit 380. The DPD processing unit 310 outputs the second pre-distorted signal to the second DAC 320-2 using the second feedback signal received from the signal selection unit 380 in response to the second control signal.

As such, the power amplifying unit 220 may reduce the size of a device and manufacturing cost thereof by sharing a feedback path between the DPD processing unit 310 and the plurality of power amplifiers 330-1, 330-2, ..., 330-$m$.

While the embodiments have been particularly shown and described, it will be understood by one of ordinary skill in the art that various changes in form and details may be made therein without departing from the spirit and scope of the present invention as defined by the appended claims.

The invention claimed is:

1. A communication device for processing signals in n different frequency bands, the communication device comprising:
   a digital pre-distortion (DPD) processor configured to output a plurality of pre-distorted signals by respectively pre-distorting a plurality of input signals, output an nth control signal when an nth input signal is input, and output an nth pre-distorted signal using an nth feedback signal input in response to the nth control signal, where n is a natural number greater than one;
   a power amplifier configured to amplify each of the plurality of pre-distorted signals and output a plurality of amplified signals;
   a signal combiner configured to combine some of the plurality of amplified signals and output a combined feedback signal;
   an analog-to-digital converter configured to convert the combined feedback signal into digital signal and output the combined feedback signal when the combined feedback signal is received from the signal combiner; and
   a filter configured to filter and output only the nth feedback signal from the combined feedback signal output by the analog-to-digital converter, wherein the nth feedback signal is a digital signal.

2. The communication device of claim 1, further comprising:
   a plurality of couplers configured to couple some of the plurality of amplified signals and output the coupled amplified signals to the signal combiner when the plurality of amplified signals are received from the power amplifier.

3. The communication device of claim 1, wherein the nth feedback signal corresponds to some of an nth amplified signal obtained by amplifying the nth pre-distorted signal.

4. The communication device of claim 1, further comprising:
   a digital-to-analog converter configured to convert the plurality of pre-distorted signals into analog signals and output the converted pre-distorted signals when the plurality of pre-distorted signals are received from the DPD processor,
   wherein the power amplifier is configured to amplify each of the plurality of pre-distorted signals that are converted into the analog signals.

* * * * *